(12) United States Patent
Hwang

(10) Patent No.: US 9,806,134 B2
(45) Date of Patent: Oct. 31, 2017

(54) DISPLAY APPARATUS, METHOD OF IMAGE DISPLAY AND TOUCH SENSE THEREOF

(75) Inventor: Tai Jiun Hwang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 13/704,632

(22) PCT Filed: Jul. 24, 2012

(86) PCT No.: PCT/CN2012/079114
§ 371 (c)(1),
(2), (4) Date: Mar. 16, 2015

(87) PCT Pub. No.: WO2014/008681
PCT Pub. Date: Jan. 16, 2014

(65) Prior Publication Data
US 2015/0194470 A1    Jul. 9, 2015

(30) Foreign Application Priority Data
Jul. 11, 2012   (CN) .......................... 2012 1 0239115

(51) Int. Cl.
*G06F 3/041* (2006.01)
*H01L 27/32* (2006.01)
*G06F 3/044* (2006.01)
*H01L 51/52* (2006.01)
*G09G 3/3233* (2016.01)

(52) U.S. Cl.
CPC ............ *H01L 27/323* (2013.01); *G06F 3/044* (2013.01); *G06F 3/0412* (2013.01); *G06F 3/0416* (2013.01); *H01L 27/3248* (2013.01); *H01L 51/5209* (2013.01); *H01L 51/5225* (2013.01); *G09G 3/3233* (2013.01); *G09G 2300/0426* (2013.01)

(58) Field of Classification Search
CPC ...... G06F 3/044; G06F 3/0416; G06F 3/0412; H01L 27/323; H01L 51/5225; H01L 27/3248; H01L 51/5209; G09G 3/3233; G09G 2300/0426
See application file for complete search history.

(56) References Cited

U.S. PATENT DOCUMENTS

2008/0018581 A1* 1/2008 Park ...................... G06F 3/0412
345/98
2008/0309627 A1* 12/2008 Hotelling .......... G02F 1/134363
345/173

(Continued)

*Primary Examiner* — Christopher E Leiby
(74) *Attorney, Agent, or Firm* — Mark M. Friedman

(57) ABSTRACT

The present invention discloses a display apparatus, comprising: a control unit, employed for setting an image display period and a touch sense period and generating image display data, a first control signal and a second control signal; a display panel, employed for displaying images and generating a touch sense signal. The present invention also discloses a method of image display and touch sense of a display apparatus. The present invention integrates the image display function and the touch sense function without stacking the touch panel and promotes the display quality.

7 Claims, 5 Drawing Sheets

(56) References Cited

U.S. PATENT DOCUMENTS

2011/0050600 A1\* 3/2011 Kim .................... G02F 1/13338
 345/173
2013/0162549 A1\* 6/2013 Kim ..................... G06F 3/0412
 345/173

\* cited by examiner

DISPLAY APPARATUS, METHOD OF IMAGE DISPLAY AND TOUCH SENSE THEREOF

BACKGROUND OF THE INVENTION

1. Field of the Invention

The present invention generally relates to a display apparatus field, and more particularly to a display apparatus and a method of image display and touch sense thereof.

2. Description of Prior Art

In a traditional touch control display apparatus, the touch sense function is realized as described below: the touch control display apparatus comprises a display panel and a touch panel. The touch panel is positioned on the display panel. The display panel is in charge of displaying images and touch panel is in charge of sensing the touch operation of the user.

As shown in FIG. 1, a traditional AMOLED (Active Matrix Organic Light Emitting Diode) display apparatus 10 comprises a substrate 105, a thin film transistor array layer 104, an anode layer 103, an OLED (organic light emitting diode layer) 102 and a cathode layer 101. The thin film transistor array layer 104 comprises a first conductor layer 1042, a second conductor layer 1044, a first insulation layer 1041 and a second insulation layer 1043. The traditional AMOLED display apparatus is not equipped with touch sense function.

For realizing the touch sense function to the aforesaid AMOLED display panel 10, the traditional way is to stack a touch panel on the AMOLED display panel 10. The display panel with touch sense function which is traditionally manufactured as aforementioned does have drawbacks: low manufacture yield, low transmission and high power consumption.

Consequently, there is a need to provide a new technical scheme for solving the foregoing technical issues.

SUMMARY OF THE INVENTION

An objective of the present invention is to provide a display apparatus which has higher manufacture yield, higher transmission and lower power consumption.

For solving the aforesaid problems, the present invention provides a display apparatus comprising a control unit, employed for setting an image display period and a touch sense period in a cycle time, and employed for generating image display data, a first control signal and a second control signal, and the first control signal is employed for controlling image display and the second control signal is employed for control touch sense; a display panel, employed for displaying images according to the image display data and generating a touch sense signal according to the first and second control signals, and transmitting the touch sense signal to the control unit; the display panel comprising: a substrate; a thin film transistor array layer, at least comprising a first conductor layer and a second conductor layer; an anode layer; an organic light emitting diode layer; a cathode layer; a sequence of the said layers from bottom to top in the display panel is the substrate, the second conductor layer, the first conductor layer, the anode layer, the organic light emitting diode layer and the cathode layer; wherein the cathode layer is provided with a predetermined pattern, and the predetermined pattern is dividing the cathode layer into a first cathode block and a second cathode block, and the first cathode block and the second cathode block are electrically coupled, and the touch sense signal is generated by the first cathode block and the second cathode block to be touched; the cathode layer, the organic light emitting diode layer, the anode layer and the thin film transistor array layer are cooperated and controlled by the first control signal to display the images in the image display period; either of the first cathode block and the second cathode block is further employed to be touched by an user to generate the touch sense signal in the touch sense period.

In the aforementioned display apparatus, the first conductor layer comprises a first conductor block and a second conductor block, and the first cathode block and the second cathode block are electrically coupled via the second conductor block.

In the aforementioned display apparatus, the anode layer comprises a main part and a conducting part, the main part and the first conductor block are electrically coupled, the first cathode block and the second cathode block are electrically coupled via the conducting part and the second conductor block.

In the aforementioned display apparatus, the cathode layer further comprises a third cathode block and a fourth cathode block, and the third cathode block and the fourth cathode block are electrically coupled in the same layer in the display apparatus where the cathode layer is positioned.

In the aforementioned display apparatus, the cathode layer further comprises a third cathode block and a fourth cathode block, and the third cathode block and the fourth cathode block are electrically coupled via the second conductor layer, and the third cathode block is electrically coupled to the second conductor layer via the anode layer and the first conductor layer, and the fourth cathode block is electrically coupled to the second conductor layer via the anode layer and the first conductor layer.

Another objective of the present invention is to provide a method of image display and touch sense of a display apparatus which has higher manufacture yield, higher transmission and lower power consumption.

For solving the aforesaid problems, the present invention provides a method of image display and touch sense of a display apparatus. The display apparatus comprises a control unit and a display panel; the method comprising steps of: (A) setting an image display period and a touch sense period in a cycle time by the control unit; (B) generating image display data, a first control signal and a second control signal by the display panel, and the first control signal is employed for controlling the image display and the second control signal is employed for control the touch sense; (C) displaying images according to the image display data in the image display period by the display panel; (D) generating a touch sense signal in the touch sense period by the display panel; (E) receiving the touch sense signal transmitted from the display panel by the control unit.

In the method of image display and touch sense of the display apparatus, the display panel comprises: a substrate; a thin film transistor array layer, at least comprising a first conductor layer and a second conductor layer; an anode layer; an organic light emitting diode layer; a cathode layer; a sequence of the said layers from bottom to top in the display panel is the substrate, the second conductor layer, the first conductor layer, the anode layer, the organic light emitting diode layer and the cathode layer; wherein the cathode layer is provided with a predetermined pattern, and the predetermined pattern is dividing the cathode layer into a first cathode block and a second cathode block, and the first cathode block and the second cathode block are electrically coupled, and the touch sense signal is generated by the first cathode block and the second cathode block to be touched; the step (C) further comprising a step of: (c1) displaying the images in the image display period with the cooperation of the cathode layer, the organic light emitting diode layer, the anode layer and the thin film transistor array layer which are controlled by the first control signal.

In the method of image display and touch sense of the display apparatus, the cathode layer is provided with a predetermined pattern, and the predetermined pattern is dividing the cathode layer into a first cathode block and a second cathode block, and the first cathode block and the second cathode block are electrically coupled; the step (D) further comprising a step of: (d1)_generating the touch sense signal in the touch sense period by either of the first cathode block and the second cathode block to be touched by an user.

In the method of image display and touch sense of the display apparatus, the step (d1) further comprises steps of: (d11) stopping displaying the images with the cooperation of the cathode layer, the organic light emitting diode layer, the anode layer and the thin film transistor array layer with control of the second control signal in the touch sense period; (d12) stopping sensing touch operation of the user with cooperation of the first cathode block and the second cathode block with control of the first control signal as the touch sense period is finished.

The traditional Active Matrix/Organic Light Emitting Diode (AMOLED) display panel is not equipped with touch sense function. The display apparatus of the present invention integrates the image display function and the touch sense function. Comparing with the traditional AMOLED display panel, the display apparatus of the present invention can realize not only the image display function but also the touch sense function which the traditional AMOLED display panel requires additional touch panel attached thereon for realizing the touch sense function. In the present invention for realizing the image display function and also the touch sense function of the AMOLED display panel, the control unit is employed to set an image display period and a touch sense period in a cycle time. The control unit controls the display panel to display images in the image display period and to sense the touch operation of the user in the touch sense period. Relative to the traditional AMOLED display panel, the display apparatus of the present invention integrates the image display function and the touch sense function in the display panel. Accordingly, the manufacture yield of the display panel is raised and the transmission of the display panel is also upgraded to promote the display quality of the display panel. Furthermore, the power consumption of the display panel according to the present invention is relatively lower to that of the traditional AMOLED display panel.

For a better understanding of the aforementioned content of the present invention, preferable embodiments are illustrated in accordance with the attached figures for further explanation.

DETAILED DESCRIPTION OF THE INVENTION

The following descriptions for the respective embodiments are specific embodiments capable of being implemented for illustrations of the present invention with referring to appended figures.

Figure 1:
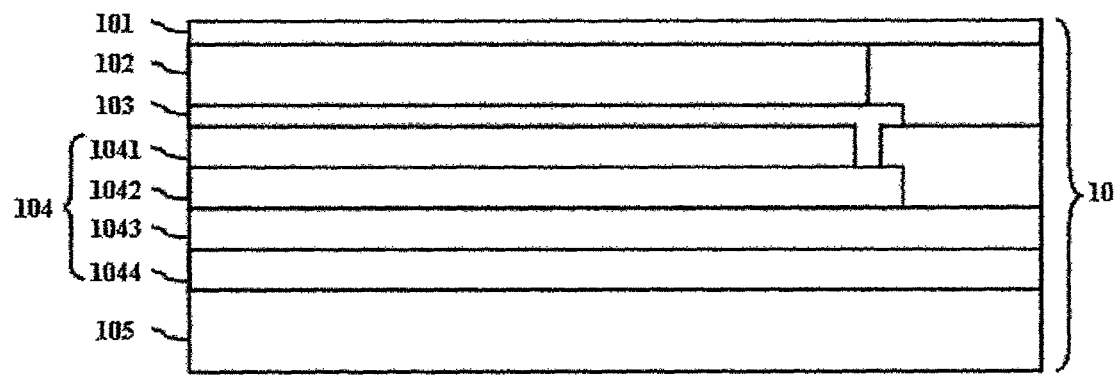
FIG. 1 depicts a partial sectional diagram of a traditional AMOLED display apparatus.
Figure 2:
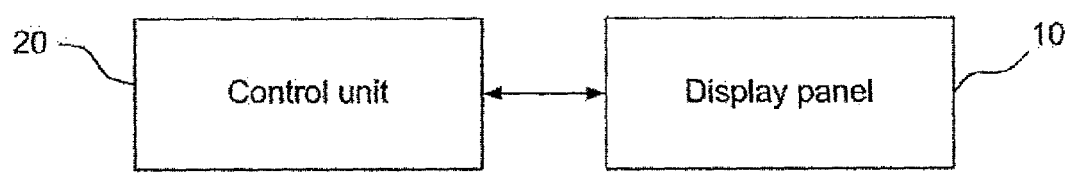
FIG. 2 depicts a functional block diagram of the display apparatus according to the present invention.

Please refer to FIG. 2, which depicts a functional block diagram of the display apparatus according to the present invention. The display apparatus of the present invention comprises a control unit 20 and a display panel 10. The control unit 20 and the display panel 10 are electrically connected. The control unit 20 is employed for controlling the image display operation and the touch sense operation of the display panel 10. Specifically, the control unit 20 is employed for setting an image display period and a touch sense period in a cycle time. The time of the image display period and the touch sense period is equal to the cycle time. The image display period and the touch sense period can be constantly and alternately changed. Nevertheless, the image display period and the touch sense period can be arranged on demand of the image display and the touch sense of a final product. For instance, the alternately changing arrangement can be optional. The feedback of the touch sense operation inputted into the control unit 20 can be an input control signal of representing a large amount of touch sense operation. Accordingly, the amount of the touch sense period can be increased or the touch sense period can be extended. Alternatively, the control unit 20 can be employed to set unequal amounts of the image display periods and the touch sense periods in a cycle time as long as the image display function and the touch sense function remain normal. Moreover, the control unit 20 is employed for generating image display data, a first control signal and a second control signal. The image display data is provided to the display panel 10 for displaying images. The first control signal is employed for controlling image display operation of the display panel 10. The second control signal is employed for control touch sense operation of the display panel 10. The display panel is employed for displaying images under the control of the control unit 20 and generating a touch sense signal based on the touch operation of an user. Specifically, the display panel 10 displays the images according to the first control signal and the image display data in the image display period. The display panel 10 generates the touch sense signal according to the second control signal and the touch operation of the user, and then transmits the touch sense signal to the control unit 20.

The display panel 10 can merely execute one kind of operation in one period. Namely, the display panel 10 merely executes displaying the images starting from the initial time point of the image display period and ending at the initial time point of the touch sense period in one cycle time. The display panel 10 merely executes the image display operation and no touch sense operation. Otherwise, in the aforesaid one cycle time, the display panel 10 merely executes the touch sense operation and no image display operation starting from the initial time point of the touch sense period and ending at the initial time point of the image display period.

In the present invention, a cathode layer 101, an organic light emitting diode layer 102, an anode layer 103 and a thin film transistor array layer 104 are cooperated to display the images. Specifically, the cathode layer 101, the organic light emitting diode layer 102, the anode layer 103 and the thin film transistor array layer 104 are cooperated and controlled by the first control signal to display the images in the image display period.

Figure 3:
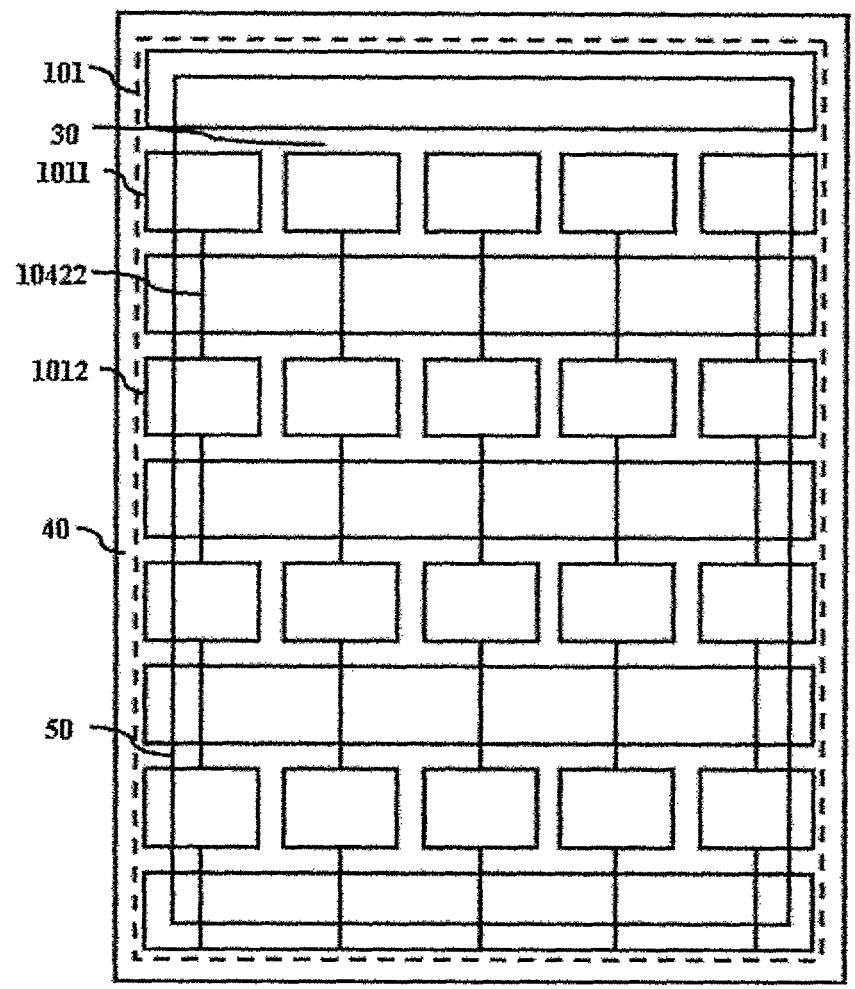
FIG. 3 depicts a diagram of the first embodiment according to the present invention.
Figure 5A:
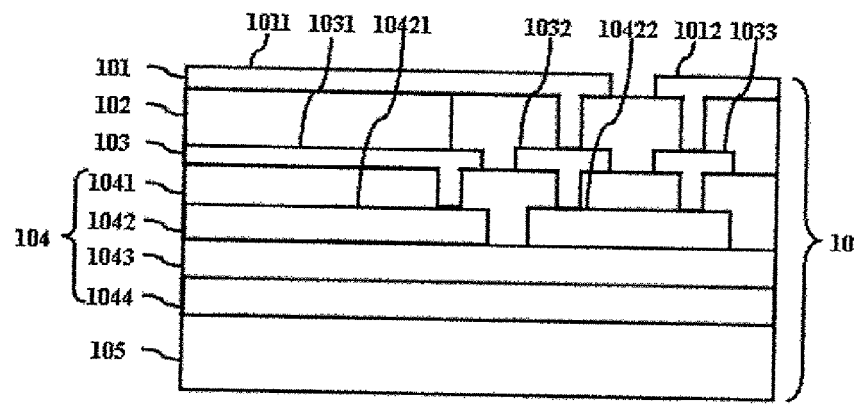
FIG. 5A depicts a partial diagram relative to the coupling type of the first cathode block and the second cathode block shown in FIG. 3 and FIG. 4.

Please refer to FIG. and FIG. 5A. FIG. 3 depicts a diagram of the first embodiment according to the present invention. FIG. 5A depicts a partial diagram relative to the coupling type of the first cathode block and the second cathode block shown in FIG. 3. In the display panel 10, the cathode layer 101 is provided with a predetermined pattern 30. The cathode layer 101 covers the display area 50 of the display panel 10. The periphery of the cathode layer 101 is a border area 40. The cathode layer 101 at least comprises two cathode blocks. The two cathode blocks can be noted as a first conductor block 1011 and a second conductor block 1012. The cathode layer 101 is are divided into the first conductor block 1011 and the second conductor block 1012 according to the predetermined pattern 30.

The display panel 10 comprises a substrate 105, a thin film transistor array layer 104, an anode layer 103, an organic light emitting diode layer 102 and a cathode layer 101. The thin film transistor array layer 104 comprises a second conductor layer 1044, a second insulation layer 1043, a first conductor layer 1042 and a first insulation layer 1041. The sequence of the said layers, the substrate 105, the thin film transistor array layer 104, the anode layer 103, the organic light emitting diode layer 102 and the cathode layer 101 are formed from bottom to top in the display panel 10. The anode layer 103 and the first conductor layer 1042 are electrically coupled.

The first conductor layer 1042 comprises a first cathode block 10421 and a second cathode block 10422. The first cathode block 10421 and the anode layer 103 are electrically coupled. The second cathode block 10422 is electrically coupled to the first conductor block 1011 and the second conductor block 1012. Specifically, the anode layer 103 comprises a main part 1031, a first conducting part 1032 and a second conducting part 1033. The first cathode block 10421 is electrically coupled to the main part 1031 of the anode layer 103. The second cathode block 10422 is electrically coupled to the first conducting part 1032 and the second conducting part 1033 of the anode layer 103. The first conductor block 1011 is electrically coupled to the second cathode block 10422 via the first conducting part 1032. The second conductor block 1012 is electrically coupled to the second cathode block 10422 via the second conducting part 1033. Therefore, the first conductor block 1011 and the second conductor block 1012 are electrically coupled via the second cathode block 10422.

In the present invention, as the touch sense period initializing, a capacitance is formed between the first conductor block 1011 and the anode layer 103 and a capacitance is also formed between the second conductor block 1012 and the anode layer 103; alternatively, a capacitance is formed between the first conductor block 1011 and the first conductor layer 1042 and a capacitance is also formed between the second conductor block 1012 and the first conductor layer 1042; alternatively, a capacitance is also formed between the first conductor block 1011 and the second conductor block 1012; alternatively, a capacitance is also formed between the first conductor block 1011 and the finger tip of the user, and a capacitance is also formed between the second conductor block 1012 and the finger tip of the user. Either of the first cathode block 1011 and the second cathode block 1012 is touched by an user to generate a signal, i.e. a touch sense signal. The control unit 20 receives the touch sense signal and calculates the touch position of the user on the display panel 10 according to the touch sense signal. Then, the control unit 20 processes system data, program data or document data according to the touch position.

Figure 4:
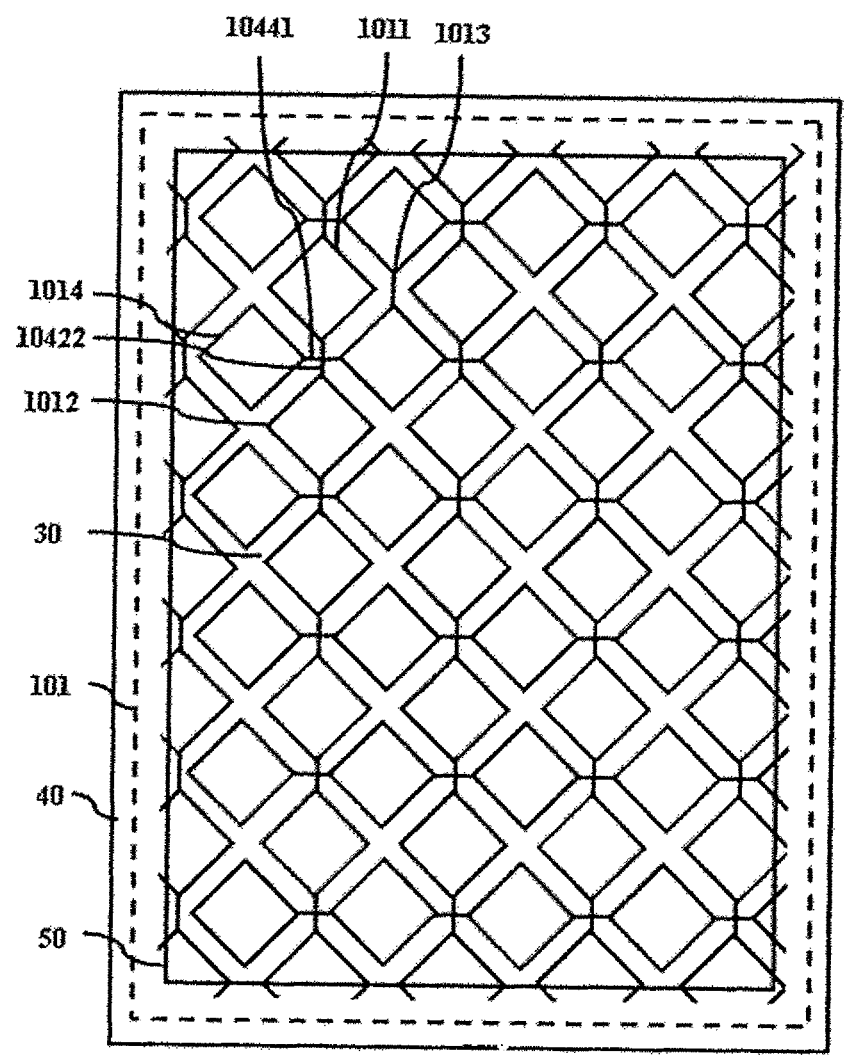
FIG. 4 depicts a diagram of the second embodiment according to the present invention.

Furthermore, for increasing the sensitivity of sensing the touch operation for the display apparatus according to the present invention, another predetermined pattern is illustrated for dividing the cathode layer in the second embodiment of the present invention. As shown in FIG. 4, in this embodiment of the present invention, the distribution of the touch sense area is denser. The display apparatus of the present invention is capable of more accurately calculating the touch position of the user on the display panel 10.

Figure 5B:
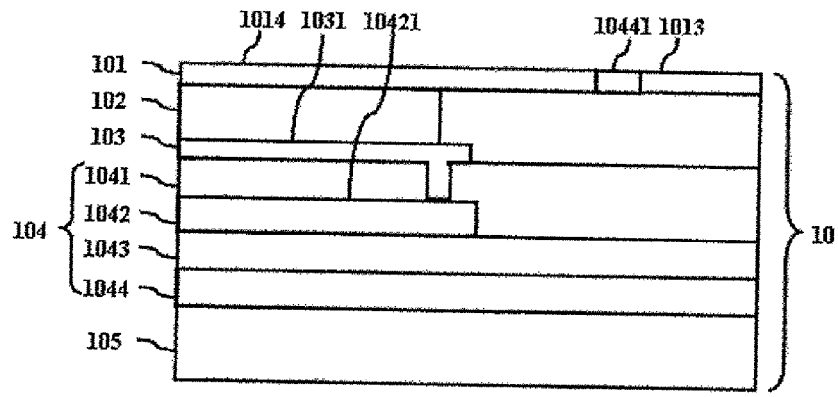
FIG. 5B depicts a partial diagram of the first embodiment relative to the coupling type of the third cathode block and the fourth cathode block shown in FIG. 4.
Figure 5C:
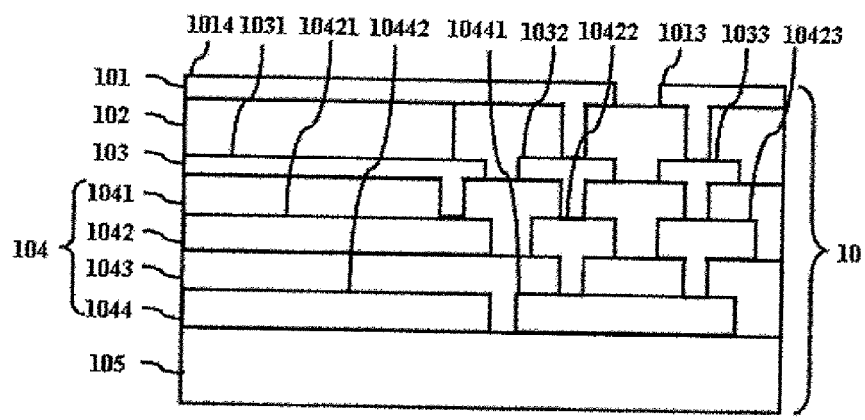
FIG. 5C depicts a partial diagram of the second embodiment relative to the coupling type of the third cathode block and the fourth cathode block shown in FIG. 4.

Please refer to FIG. 4, FIG. 5A, FIG. 5B and FIG. 5C. FIG. 4 depicts a diagram of the second embodiment according to the present invention. FIG. 5A depicts a partial diagram relative to the coupling type of the first cathode block and the second cathode block shown in FIG. 4. FIG. 5B depicts a partial diagram of the first embodiment relative to the coupling type of the third cathode block and the fourth cathode block shown in FIG. 4. FIG. 5C depicts a partial diagram of the second embodiment relative to the coupling type of the third cathode block and the fourth cathode block shown in FIG. 4.

As shown in FIG. 4, in the display apparatus of the present invention, the cathode layer 101 is provided with a predetermined pattern 30. The cathode layer 101 covers the display area 50 of the display panel 10. The periphery of the cathode layer 101 is a border area 40. The cathode layer 101 comprises a first cathode block 1011, a second cathode block 1012, a third cathode block 1013 and a fourth cathode block 1014. The first cathode block 1011, the second cathode block 1012, the third cathode block 1013 and the fourth cathode block 1014 are derived by dividing the cathode layer 101 according to the predetermined pattern 30.

As shown in FIG. 5A, the display panel 10 comprises a substrate 105, a thin film transistor array layer 104, an anode layer 103, an organic light emitting diode layer 102 and a cathode layer 101. The thin film transistor array layer 104 comprises a second conductor layer 1044, a second insulation layer 1043, a first conductor layer 1042 and a first insulation layer 1041. The sequence of the said layers, the substrate 105, the thin film transistor array layer 104, the anode layer 103, the organic light emitting diode layer 102 and the cathode layer 101 are formed from bottom to top in the display panel 10. The anode layer 103 and the first conductor layer 1042 are electrically coupled.

The first conductor layer 1042 comprises a first cathode block 10421 and a second cathode block 10422. The first cathode block 10421 and the anode layer 103 are electrically coupled. The second cathode block 10422 is electrically coupled to the first conductor block 1011 and the second conductor block 1012. Specifically, the anode layer 103 comprises a main part 1031, a first conducting part 1032 and a second conducting part 1033. The first cathode block 10421 is electrically coupled to the main part 1031 of the anode layer 103. The second cathode block 10422 is electrically coupled to the first conducting part 1032 and the second conducting part 1033 of the anode layer 103. The first conductor block 1011 is electrically coupled to the second cathode block 10422 via the first conducting part 1032. The second conductor block 1012 is electrically coupled to the second cathode block 10422 via the second conducting part 1033. Therefore, the first conductor block 1011 and the second conductor block 1012 are electrically coupled via the second cathode block 10422.

As shown in FIG. 5B, the third cathode block 1013 and the fourth cathode block 1014 are electrically coupled. Specifically, the third cathode block 1013 and the fourth cathode block 1014 are electrically coupled in the same layer in the display apparatus 10 where the cathode layer 101 is positioned. A conducting wire 10441 is formed between the third cathode block 1013 and the fourth cathode block 1014. The conducting wire 10441 is electrically coupling the third cathode block 1013 and the fourth cathode block 1014. In a specific implementation, the pattern of the third cathode block 1013 and the pattern of the fourth cathode block 1014 are set up in the connecting status in the process of setting the predetermined pattern 30. Then, the cathode layer 101 is divided into the third cathode block 1013 and the fourth cathode block 1014 according to the predetermined pattern 30.

As shown in FIG. 5C, the third cathode block 1013 and the fourth cathode block 1014 are electrically coupled in the same layer in the display apparatus 10 where the second conductor layer 1044 is positioned. Namely, the second conductor layer 1044 comprises a third conductor block 10441. The third conductor block 10441 is separated from the fourth conductor block 10442 of the second conductor layer 1044. The third cathode block 1013 and the fourth cathode block 1014 are electrically coupled via the third conductor block 10441. Specifically, the third cathode block 1013 and the fourth cathode block 1014 are electrically coupled to the third conductor block 10441 via the first conducting part 1032, the second conducting part 1033, the second cathode block 10422 and the third cathode block 10423.

Either of the third cathode block 1013 and the fourth cathode block 1014 can be touched to generate a touch sense signal as similar as that either of the first cathode block 1011 and the second cathode block 1012 can be touched to generate a touch sense signal likewise.

Figure 6:
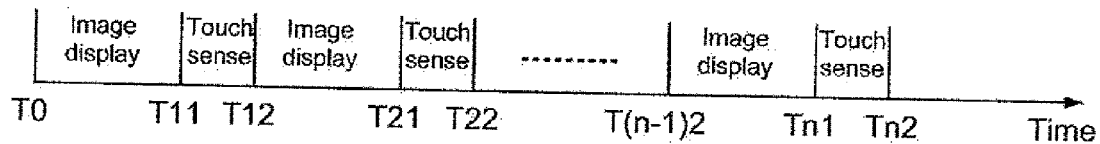
FIG. 6 shows a functional timing chart of a method of image display and touch sense of a display apparatus according to the present invention.
Figure 7:
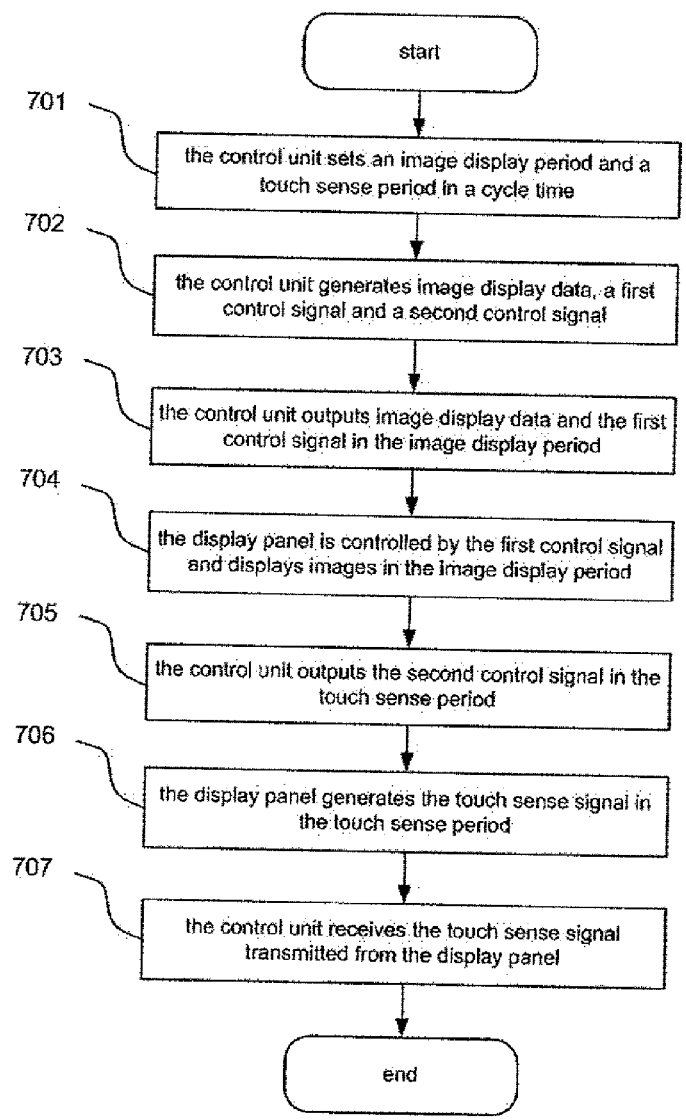
FIG. 7 shows a flowchart of a method of image display and touch sense of a display apparatus according to the present invention.

Please refer to FIG. 2 to FIG. 7. FIG. 6 shows a functional timing chart of a method of image display and touch sense of a display apparatus according to the present invention. FIG. 7 shows a flowchart of a method of image display and touch sense of a display apparatus according to the present invention. The method of image display and touch sense is applied to the display apparatuses shown in FIG. 2 to FIG. 5 (FIG. 5A, FIG. 5B and FIG. 5C). The time period from T0 to T11 is the image display period in the cycle time. The time period from T11 to T12 is the touch sense period in the cycle time. The time period from T12 to T21 is the image display period in the cycle time. The time period from T21 to T22 is the touch sense period in the cycle time and so on. The display apparatus of the present invention displays images in the image display period and senses the touch operations of the user to generate the touch sense signals. The image display period and the touch sense period are both smaller than the cycle time. The sum of the image display periods and the touch sense periods is equal to the cycle time.

As shown in FIG. 7, in Step 701, the control unit 20 sets an image display period and a touch sense period in a cycle time. In Step 702, the control unit 20 generates image display data, a first control signal and a second control signal. The image display data is employed to be provided to the display panel 10 for displaying images. The first control signal is employed for controlling the display panel 10 to display images as starting the image display period. The second control signal is employed for controlling the display panel 10 to sense the touch-operations of the user to generate the touch sense signals. In Step 703, the control unit 20 outputs image display data and the first control signal to the display panel 10 in the image display period. In Step 704, the display panel 10 displays images according to the image display data in the image display period. Specifically, the cathode layer 101, the organic light emitting diode layer 102, the anode layer 103 and the thin film transistor array layer 104 are cooperated and controlled by the first control signal to display the images in the image display period. In Step 705, the control unit 20 outputs the second control signal to the display panel 10 and receives feedback signals (the touch sense signal) transmitted from the display panel 10 in the touch sense period. In Step 706, the display panel 10 senses the touch operation of the user under the control of the second control signal in the touch sense period. The display panel 10 generates the touch sense signal according to the touch operation of the user and transmits the touch sense signal to the control unit 20. Specifically, either of the first cathode block 1011 and the second cathode block 1012 is touched by the user and generates an abnormal current. The abnormal current is the touch sense signal. In Step 707, the control unit 20 receives the touch sense signal transmitted from the display panel 10. By analyzing the touch sense signal, the control unit 20 can calculate the touch position of the user on the display panel 10.

The traditional AMOLED display panel is not equipped with touch sense function. The display apparatus of the present invention integrates the image display function and the touch sense function. Comparing with the traditional AMOLED display panel, the display apparatus of the present invention can realize not only the image display function but also the touch sense function which the traditional AMOLED display panel requires additional touch panel attached thereon for realizing the touch sense function.

In the present invention for realizing the image display function and also the touch sense function of the display panel 10, the control unit 20 is employed to set an image display period and a touch sense period in a cycle time. The control unit 20 controls the display panel 10 to display images in the image display period and to sense the touch operation of the user in the touch sense period.

Relative to the traditional AMOLED display panel, the display apparatus of the present invention integrates the image display function and the touch sense function in the display panel. Accordingly, the manufacture yield of the display panel 10 is raised without stacking the touch panel and the transmission of the display panel 10 is also upgraded to promote the display quality of the display panel 10. Furthermore, the power consumption of the display panel according to the present invention is relatively lower to that of the traditional AMOLED display panel without the power consumption of the touch panel.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A display apparatus, comprising:
a control unit setting an image display period and a touch sense period of the display apparatus in a cycle time according to demand of the image display period and the touch sense period, and generating image display data, a first control signal and a second control signal; the first control signal is employed for controlling image display and the second control signal is employed for controlling touch sense; a sum of time of the image display period and time of the touch sense period is equal to the cycle time, and the image display period and the touch sense period are alternately changed; wherein duration of the image display period and the touch sense period within the cycle time are changeable by the control unit;
a display panel, employed for displaying images according to the image display data and generating a touch sense signal according to the first and second control signals, and transmitting the touch sense signal to the control unit;
the display panel comprising:
a substrate;
a thin film transistor array layer, at least comprising a first conductor layer and a second conductor layer;
an anode layer;
an organic light emitting diode layer;
a cathode layer, wherein the cathode layer covers a display area of the display panel;
a sequence of the said layers from bottom to top in the display panel is the substrate, the second conductor layer, the first conductor layer, the anode layer, the organic light emitting diode layer and the cathode layer;
wherein the cathode layer is divided into a first cathode block and a second cathode block according to a predetermined pattern, the first cathode block and the second cathode block are electrically coupled together, and wherein direct touch of the first cathode block or the second cathode block by a user generates the touch sense signal in the touch sense period;
the cathode layer, the organic light emitting diode layer, the anode layer and the thin film transistor array layer are cooperated and controlled by the first control signal to display the images, in the display area, in the image display period;
wherein the first conductor layer comprises a first conductor block and a second conductor block, and the first cathode block and the second cathode block are electrically coupled via the second conductor block;
wherein the anode layer comprises a main part, a first conducting part, and a second conducting part, the main part and the first conductor block are directly coupled, the first conducting part is directly connected between the first cathode block and the second conductor block, and the second conducting part is directly connected between the second cathode block and the second conductor block.

2. The display apparatus according to one of claim 1, wherein the cathode layer further comprises a third cathode block and a fourth cathode block, and the third cathode block and the fourth cathode block are electrically coupled in the same layer in the display apparatus where the cathode layer is positioned.

3. The display apparatus according to claim 1, wherein the cathode layer further comprises a third cathode block and a fourth cathode block, and the third cathode block and the fourth cathode block are electrically coupled via the second conductor layer, and the third cathode block is electrically coupled to the second conductor layer via the anode layer and the first conductor layer, and the fourth cathode block is electrically coupled to the second conductor layer via the anode layer and the first conductor layer.

4. A method of image display and touch sense of a display apparatus, wherein display apparatus comprises a control unit and a display panel;
the method comprising steps of:
(A) setting an image display period and a touch sense period of the display apparatus in a cycle time by the control unit according to demand of the image display period and the touch sense period by the control unit, a sum of time of the image display period and time of the touch sense period is equal to the cycle time, and the image display period and the touch sense period are alternately changed, wherein duration of the image display period and the touch sense period within the cycle time are changeable by the control unit;
(B) generating image display data, a first control signal and a second control signal by the display panel, and the first control signal is employed for controlling the image display and the second control signal is employed for control the touch sense;
(C) displaying images according to the image display data in the image display period by the display panel;
(D) generating a touch sense signal in the touch sense period by the display panel;
(E) receiving the touch sense signal transmitted from the display panel by the control unit;
the display panel comprising:
a cathode layer, wherein the cathode layer covers a display area of the display panel;
wherein the cathode layer is divided into a first cathode block and a second cathode block according to a predetermined pattern, the first cathode block and the second cathode block are electrically coupled together, and wherein direct touch of the first cathode block or the second cathode block by a user generates the touch sense signal in the touch sense period, wherein the cathode layer, the organic light emitting diode layer, the anode layer, and the thin film transistor array layer are cooperated and controlled by the first control signal to display the images, in the display area, in the image display period;
wherein the display panel comprises:
a substrate;
a thin film transistor array layer, at least comprising a first conductor layer and a second conductor layer;
an anode layer;
an organic light emitting diode layer;
a sequence of the said layers from bottom to top in the display panel is the substrate, the second conductor layer, the first conductor layer, the anode layer, the organic light emitting diode layer, and the cathode layer;
wherein the first conductor layer comprises a first conductor block and a second conductor block, and the first cathode block and the second cathode block are electrically coupled via the second conductor block;
wherein the anode layer comprises a main part, a first conducting part, and a second conducting part, the main part and the first conductor block are directly coupled, the first conducting part is directly connected between the first cathode block and the second conductor block, and the second conducting part is directly connected between the second cathode block and the second conductor block.

5. The method of image display and touch sense of the display apparatus according to claim 4, wherein:
the step (C) further comprising a step of:
(c1) displaying the images in the image display period with the cooperation of the cathode layer, the organic light emitting diode layer, the anode layer and the thin film transistor array layer which are controlled by the first control signal.

6. The method of image display and touch sense of the display apparatus according to claim 5, wherein the cathode layer is provided with a predetermined pattern, and the predetermined pattern is dividing the cathode layer into the first cathode block and the second cathode block;
the step (D) further comprising a step of:
(d1) generating the touch sense signal in the touch sense period by either of the first cathode block and the second cathode block to be touched by an user.

7. The method of image display and touch sense of the display apparatus according to claim 6, wherein the step (d1) further comprises steps of:
(d11) stopping displaying the images with the cooperation of the cathode layer, the organic light emitting diode layer, the anode layer and the thin film transistor array layer with control of the second control signal in the touch sense period;
(d12) stopping sensing touch operation of the user with cooperation of the first cathode block and the second cathode block with control of the first control signal as the touch sense period is finished.

* * * * *